United States Patent
Nickel et al.

(10) Patent No.: US 7,103,718 B2
(45) Date of Patent: Sep. 5, 2006

(54) NON-VOLATILE MEMORY MODULE FOR USE IN A COMPUTER SYSTEM

(75) Inventors: Janice H. Nickel, Sunnyvale, CA (US); Manish Sharma, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 65 days.

(21) Appl. No.: 10/234,424

(22) Filed: Sep. 3, 2002

(65) Prior Publication Data

US 2004/0044838 A1 Mar. 4, 2004

(51) Int. Cl.
*G06F 12/00* (2006.01)
(52) U.S. Cl. ....................... 711/115; 711/104
(58) Field of Classification Search ............... 711/104, 711/100
See application file for complete search history.

(56) References Cited

U.S. PATENT DOCUMENTS

2002/0030917 A1* 3/2002 Haitani ................. 360/71
2002/0083288 A1* 6/2002 Kim ..................... 711/173
2002/0154156 A1* 10/2002 Moriwake et al. ......... 345/716
2003/0005213 A1* 1/2003 Suzuki .................. 711/103

FOREIGN PATENT DOCUMENTS

JP 2002-209962 * 7/2002

OTHER PUBLICATIONS

The Authoritative Dictionary of IEEE Standards Terms, 2000, IEEE Press, Seventh Edition, p. 574.*
Microsoft Computer Dictionary, 1999, Microsoft Press, Fourth Edition, p. 286.*

* cited by examiner

*Primary Examiner*—Mano Padmanabhan
*Assistant Examiner*—Midys Rojas

(57) ABSTRACT

A non-volatile memory module for use in a computer system is disclosed. The non-volatile memory module is capable of storing information indefinitely and can be inserted and removed from the computer system during operation. The non-volatile memory can serve as the main memory within the computer system to hold the operating system and any other programs that are accessed by the computer system during operation.

33 Claims, 3 Drawing Sheets

NON-VOLATILE MEMORY MODULE FOR USE IN A COMPUTER SYSTEM

BACKGROUND OF THE INVENTION

1. Field of the Invention

The present invention relates generally to computer systems with memory and, more particularly, the present invention relates to a computer system having insertable non-volatile memory modules.

2. Related Art

Computer systems always include at least one memory store. A typical computer system includes a main memory store and at least one type of non-volatile memory. The main memory store typically uses fast, volatile memory to store an operating system and programs that run while the computer is operating. The volatile memory typically comprises random access memory (RAM) and is considered the main memory for the computer system. The non-volatile memory is used to store data and programs without fear of loss upon power down, power interruptions, or computer malfunction. The non-volatile memory typically comprises a hard disk drive, floppy drive, or CD drive. The non-volatile memory is typically considered the secondary memory for the system.

The main memory, or RAM, is typically smaller in size, faster in speed, and more expensive in cost, than the secondary memory storage. Practically all current non-volatile memory storage technologies, such as magnetic hard drives, magnetic tape or floppy drives, optical media, magneto-optic, phase-change, polymer, plastic, FLASH, as well as other media, are slower by at least one order of magnitude than the RAM technologies currently available and are often several orders of magnitude slower. RAM technologies include static RAM (SRAM) and dynamic RAM (DRAM), both of which have their advantages and disadvantages and are used extensively in today's computer systems.

Computer systems have advanced to the stage where certain peripheral devices can be "hotplugged" directly into the computer system while it is operating. The computer system will recognize the peripheral device and accept it as if it had always existed from the time of bootup or powerup for the computer system. "Hotplugging" is defined as the ability to insert or remove a peripheral device within the computer system while it is running.

Volatile memory requires that it be powered constantly in order for the contents of the memory to be preserved. Thus, a volatile memory cannot utilize the hotplugging capability provided in today's computer systems without a loss of data either prior to insertion or after loss of power while inserted in the system. Furthermore, an abrupt power surge or drop can be catastrophic to such memory and is to be avoided. Otherwise, the memory will be destroyed or at least damaged to some extent.

Recent advances in memory technology have included the development of magnetic RAM (MRAM). MRAM stores information magnetically, so it does not require a constant power supply, as does current RAM technology. This quality is known as non-volatility. MRAM can offer all the advantages in speed and size that volatile memory offers and brings the added advantage of being non-volatile and, in some architectural configurations, cheaper to manufacture. MRAM can operate at speeds similar to either SRAM or DRAM, thus allowing it to be utilized within main memory.

It is desirable to provide a memory module system that can be inserted within a computer system during operation in such a way as to avoid losing the module's prior memory state and to avoid catastrophic failure of either the module or the computer system that would otherwise result in prior art memory systems.

SUMMARY OF THE INVENTION

According to the present invention, a non-volatile memory module for use in a computer system is disclosed. The non-volatile memory module is capable of storing information indefinitely and can be inserted and removed from the computer system during operation. The non-volatile memory module can serve as the main memory within the computer system to hold the operating system and any other programs that are accessed by the computer system during operation.

The computer system includes a central processing unit (CPU), a main memory, which is coupled to the CPU, supplemental main memory, secondary memory, and other input and output devices that are typically coupled to the CPU. The main memory serves to hold the operating system and any other programs that are accessed by the CPU during operation. The supplemental main memory is insertable and removable from the computer system during operation of the computer system.

A protocol or method is also disclosed that allows the computer system to recognize and utilize the non-volatile memory module when added to the computer system during a power state.

Additional features and advantages of the invention will be apparent from the detailed description which follows, taken in conjunction with the accompanying drawings, which together illustrate, by way of example, features of the invention.

DETAILED DESCRIPTION OF SPECIFIC EMBODIMENTS

Figure 1:
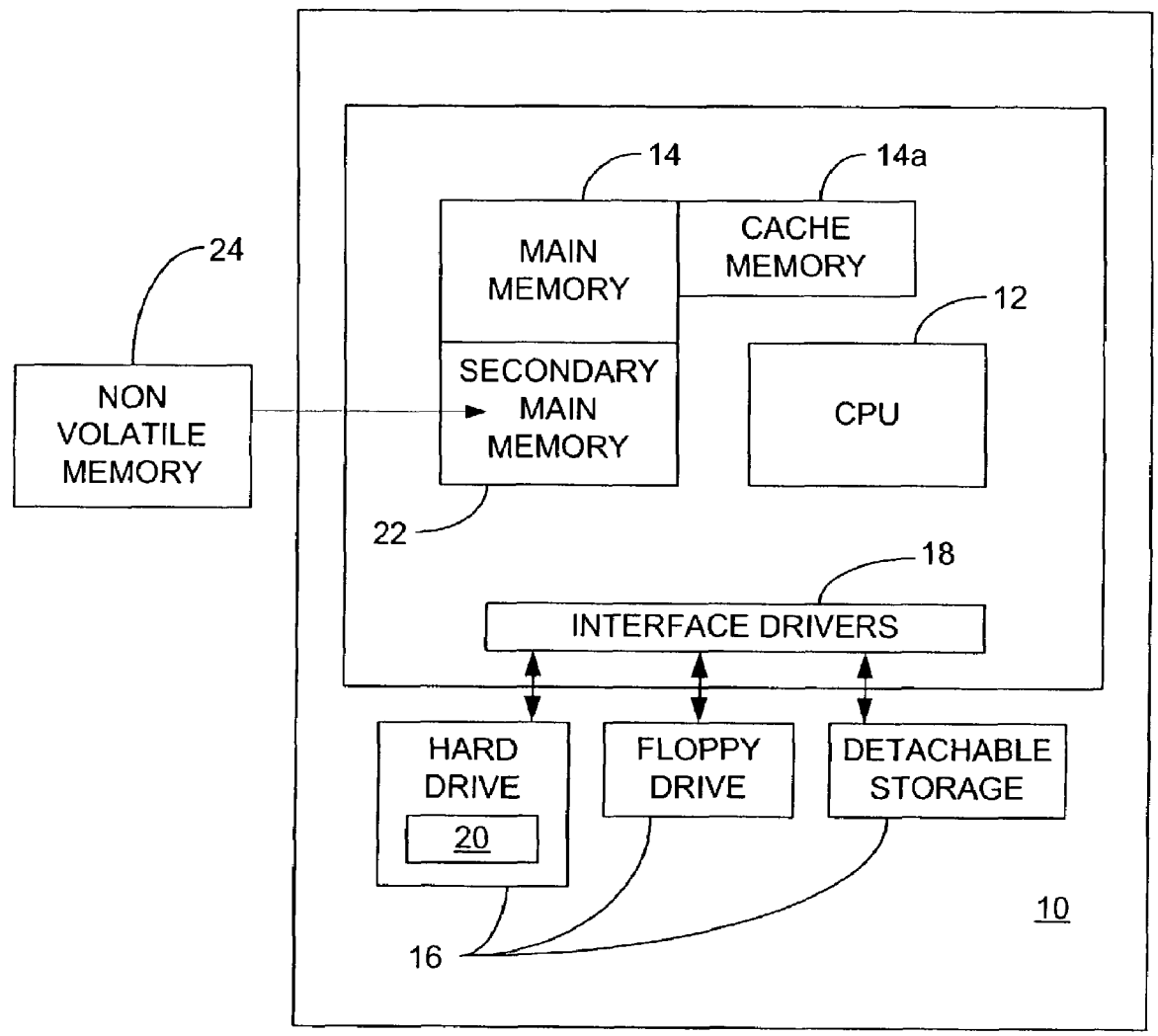
FIG. 1 is a schematic diagram of a computer system capable of receiving non-volatile main memory in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

A computer system 10 is illustrated in FIG. 1. Computer system 10 comprises many of the components normally found in a modern-day computer system. For example, the computer system 10 includes a CPU 12, a main memory store 14, which may have a cache memory 14a, and a secondary memory 16, which collectively includes a hard disk, a floppy disk, or other detachable storage such as a CD-ROM, DVD, or magnetic tape store. Computer system 10 further includes an interface driver 18 for each of the secondary memory stores 16. Computer system 10 also includes basic input and output devices such as a keyboard, point device, printer port and monitor (not shown). Interface driver 18 also manages the peripheral devices as they interface with the computer system 10 and is well known to the skilled artisan. Computer system 10 can be a desk-top computer, a laptop computer, a network server, hand-held personal digital assistants, portable phones, gaming system, or any other type of computer system that utilizes a processor and would benefit from using fast, persistent storage means.

Upon power-up or boot up, computer system 10 loads an operating system 20 from a secondary memory source 16 to the main memory 14. Currently, main memory 14 typically comprises volatile fast memory, such as SRAM or DRAM, and may also include a much smaller but even faster memory store known as cache memory 14a. During initial power-up, the computer system 10 goes through a routine of loading the operating system 20 in main memory 14, identifying all peripherals and main memory and secondary memory available to the computer system, and confirming that such are in proper working order and will be accessible during the operational phase of the computer system.

In an alternative embodiment, the main memory 14 comprises a non-volatile memory 24, which can store the operating system and the prior state of the computer before power down. In this case, the computer is in proper working order upon power-up when the operating system and prior state of the computer are saved prior to power down.

Computer system 10 also includes the ability to supplement the main memory 14 with additional secondary main memory 22 that operates roughly at the same speed as conventional SRAM or DRAM, and is non-volatile. The secondary main memory 22 can include fast, non-volatile memory 24, such as magnetic random access memory (MRAM) or Ferroelectric RAM (FeRAM), either of which can also be inserted within or removed from computer system 10 regardless of whether the power is on or off. Since non-volatile memory 24 can store content indefinitely, there are distinct advantages over the prior art. For example, one can now install very fast system memory that has data or executable images of programs stored within prior to installation. Another advantage is that additional memory can be added when needed without having to shut down the computer system, open up the physical computer system, install the memory, and boot up the system again. The steps of installing the additional memory can be accomplished while the computer is in an operating state in a fraction of the time as the prior art.

MRAM technology has been shown to operate at speeds of less than 10 nanoseconds, which is comparable to both RAM systems and cache memory. As such, non-volatile memory 24 can be designed as modules that allow them to be inserted into the computer system and recognized by the system for inclusion during operation of the system. Additionally, non-volatile memory 24 are much less expensive than conventional RAM used in the main memory system, which reduces the cost of memory used within the computer system.

MRAM modules or non-volatile memory 24 may also be produced to operate at the same speed as SRAM or DRAM as well as to be of proportionally the same size as SRAM or DRAM, which makes them compatible for insertion within the computer system to function as either the main memory 14 or the supplemental main memory 22, or both.

A protocol is necessary for the computer system to recognize when additional memory is inserted or removed from the main memory of the computer system. MRAM modules 24 typically include sense amplifiers on chip that perform the voltage sensing necessary to discern the nature of data stored in the memory module. Thus, any time the MRAM module 24 is powered-up, the memory module must perform a setup and calibration step to calibrate the voltage sensing levels of the sense amplifiers. The range and selected setup values for reducing the time of the calibration process can be stored in a setup portion of the MRAM itself. Thus, a portion of the MRAM module 24 is set aside for storing the setup related data. As the MRAM is non-volatile, the calibration values are always available for later powerup cycles and improve the calibration or reduce the time necessary for calibration.

Figure 2:
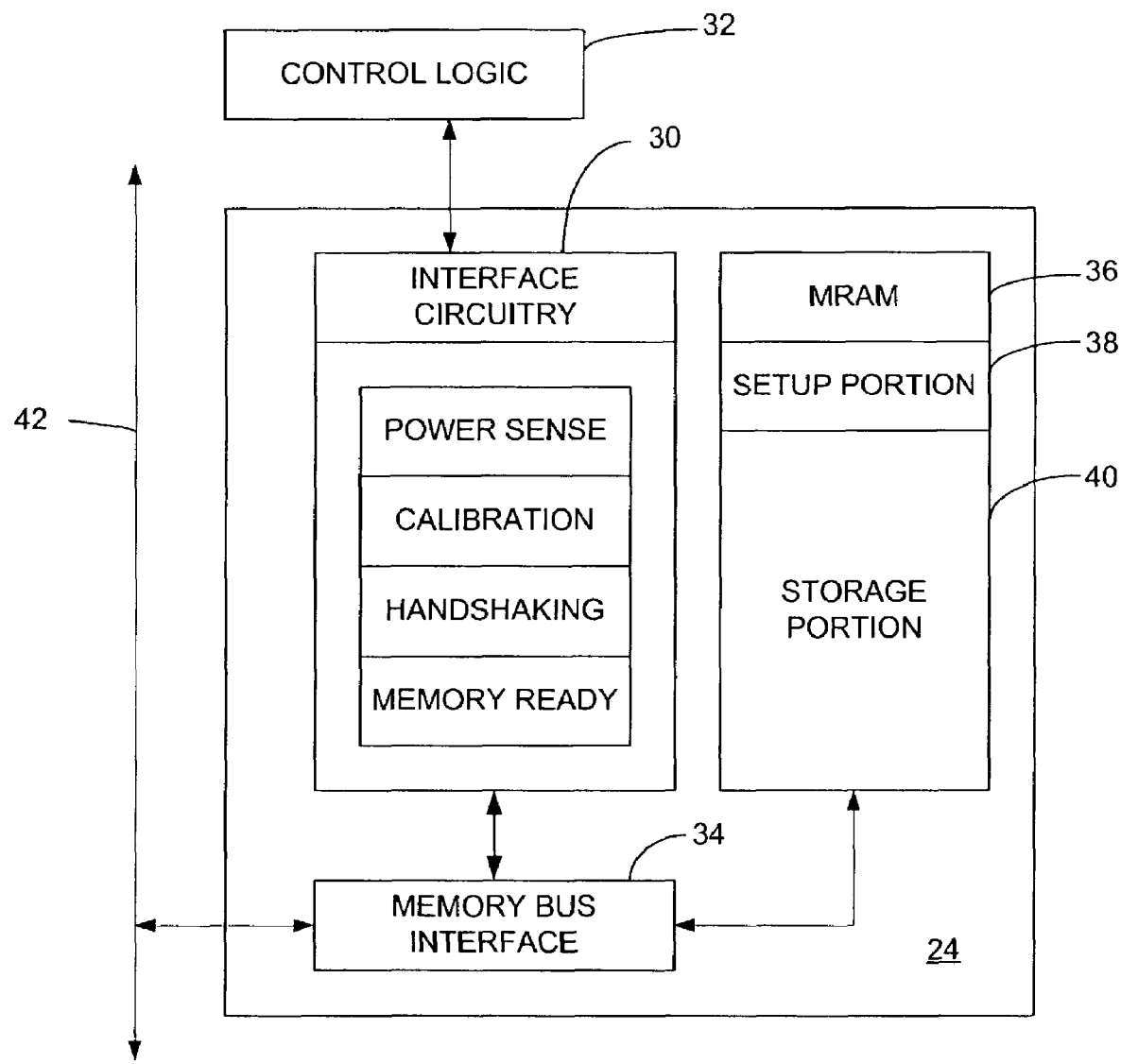
FIG. 2 is a schematic diagram of a non-volatile memory module of FIG. 1 in accordance with an embodiment of the present invention.
Figure 3:
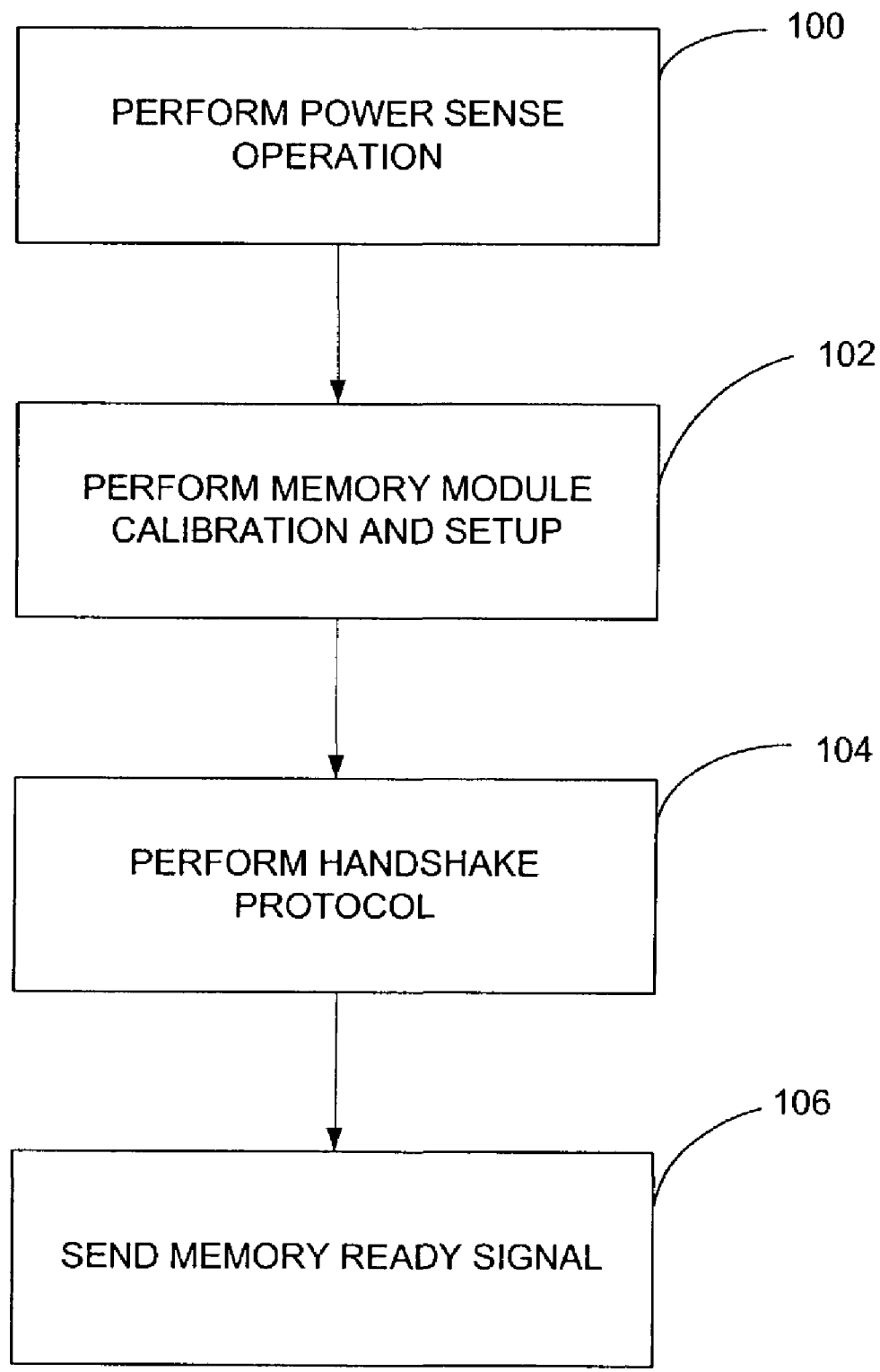
FIG. 3 is a flow chart of the protocol of recognizing the non-volatile memory module as installed in the computer system in accordance with an embodiment of the present invention.

The protocol or process for including a recently installed MRAM module 24 within computer system 10 is shown in the logic diagram of FIG. 2 as well as in the flow diagram of FIG. 3. The memory module includes interface circuitry 30, which further couples to a control logic 32. Control logic 32 refers to the command signals given by the rest of the computer system to the memory module to access its data. The computer system may set the address and data on the bus 42 and then send signals to write that data into the memory portion; or, it may set the address and send signals to the memory to read data from that address and put it onto the bus; or, it may send configuration and control signals for other purposes. Interface circuitry 30 enables the MRAM module 24 to perform a power sense operation for when power is provided to the memory module upon insertion within the computer system, which is depicted in block 100. Next, interface circuitry 30 performs a calibration and setup step as shown in block 102, based on the range and set of values stored within the interface circuitry. Then, as shown in block 104, the system performs a series of handshaking protocol between the MRAM memory module and the computer system via a memory bus interface 34, which is further coupled to the actual MRAM cells 36. Stored within MRAM cells 36 are the setup values for calibration as previously mentioned. Thus, MRAM cells 36 are divided into setup portion 38 and main storage portion 40. Main storage portion 40 stores data received from computer system 10 during operation and comprises the bulk of the memory elements within MRAM cells 36.

Once all the protocols are performed and completed satisfactorily and everything is considered to be acceptable, a memory ready signal is sent to the memory bus to indicate that the MRAM module 24 is ready for access within computer system 10, which step is shown in block 106. At this point, data can be written or read over the system bus interface 34, where the memory bus, in communication with operating system 20 via computer system bus 42, then accepts the MRAM module 24 as being plugged in and considered part of the system resources within computer system 10. The MRAM module 24 is now ready to be accessed within the computer system via the operating system.

If the MRAM module 24 is part of main memory 14 or is intended to be a permanent part of computer system 10, the operating system typically will be stored with MRAM module 24. Further, the computer state saved at the time of power-down is also stored within MRAM module 24 to provide faster computer set up during power-up. Should the user not wish to save the last computer state at the time of power down, no such state will be saved and the computer system 10 performs a traditional power-up to an operating state with operating system already stored in MRAM module 24.

One issue relevant to the hot-plugged MRAM technology described here is latency. Latency is defined within the context of this invention as the time that it takes for the MRAM module to be plugged into the memory bus, recognized, and then made ready for data access or storage. The ability to plug and access MRAM memory modules directly into the computer system does not mean that the information is available instantaneously, but a modest latency time is required for the setup procedure, calibration steps, and memory to be stabilized. Latency time can be up to several milliseconds long. Although the memory bus recognizes immediately when an MRAM module is plugged into the system, the time necessary to program and run the setup and calibration portions that must be performed prior to accessing or writing data in the supplemental memory must be considered.

The latency for accessing the supplemental memory described here must be differentiated from the more common definition of latency referring to the time it takes to access data stored in a memory type. For MRAM, such latency times vary depending upon the type of architecture utilized. An MRAM memory module is comprised of magnetic bits stored typically in a crosspoint architecture, with row and column conductors for random addressing of individual bits. There are two basic architectures currently considered for MRAM memory. The type of architecture used affects both the read and write access time as well as the cost of the chip.

The first type of MRAM utilizes one transistor per bit and the transistor enables fast switching times for both read and write operations in order to access the data or store new data. The memory cell operates at very fast times, typically lower than ten nanoseconds in either the read or write operation. The use of transistors, however, increases the cost of the memory cell, since additional fabrication steps are required to make the transistors.

The second type of MRAM utilizes an equipotential method of sensing, wherein the bits are in a crosspoint array without transistors and thus not isolated from each other. This memory system, however, operates somewhat slower in speed than the transistor-based system, but is much less expensive to fabricate, as there are fewer fabrication steps necessary. The write times can be less than ten nanoseconds, but often read times approach ten microseconds. A variation of this architecture is to produce a diode in series with the bit, which provides some isolation, and improves access time, but still is slower than the architecture utilizing transistors.

Hot-plugged systems also need electrostatic protection. Because of electrostatic charge buildup, adding a module such as a memory chip into a running system has the potential to damage either the module, system board, or other sensitive electronics, or any combination thereof. The pins in the socket should include electrostatic protection circuitry to protect both the memory chip being plugged in and the system board where it is being plugged in. Circuits for doing this safely are well known in the art and can include a resistor-capacitor discharge circuit, discharge diodes, or other suitable discharge circuits.

Several advantages are obtained in the implementation of the hot insertable MRAM modules in accordance with the present invention. The first advantage is the ability to physically extend the main memory in a computer system that is already running with the operating system fully loaded. In this application, the use of non-volatile memory modules that are comparable to current technology, i.e. high-speed RAM modules, enables the main memory of the computer to be enhanced. This enhancement is obtained with very little interruption to the user.

A second advantage is the non-volatile characteristic of MRAM cells, which allows executable images of programs to be stored within the MRAM cell. When the pre-programmed MRAM cell is attached directly to the main memory, the stored executable images will be effectively loaded in memory, without needing to access the original program executable files typically stored in the secondary storage of the computer system. Thus the user is able to avoid the access latency time required to load the executable program into main memory from the secondary memory, which, depending on the size of the program, may take up to several minutes. Further, the system can recognize the MRAM module 24 as a hardware only or system element rather than at the operating or software level.

Further still, the executable program, with or without associated data, can be preloaded within an MRAM module 24 for commercial release, in the same manner that programs are currently made commercially available on CD-ROMs. A key can be utilized, as stored for recognition within the setup portion 38, to gain access to the program stored thereon after installation within the computer system. The MRAM module 24 is suitable for use with gaming systems that utilize memory cartridges with the game information stored therein.

One application where the use of a hot insertable memory module is particularly advantageous is for laptops. Often a user of a laptop or mobile computer requires extra memory to run certain large programs. The MRAM module can be used to satisfy these requirements. In accordance with the first advantage described above, memory can be enhanced with the addition of an MRAM module that couples directly with the main RAM memory and is recognized by the operating system as RAM memory. In accordance with the second advantage described above, the user is able to store executable program images of any particular program within the MRAM module. The module can then be plugged into an MRAM slot in the computer in much the same way as a floppy disk or flash memory card would be inserted within the computer system. It should be noted that the main memory modules or the MRAM modules can be either PCMCIA compatible or USB port compatible. The benefit is that the effective RAM available is effectively instantaneously increased with the addition of the MRAM hot-plugged module. Further, the program images stored on the MRAM modules are accessed instantly. This reduces loading time of a program as compared with slower secondary storage systems. In addition, use of MRAM modules to store executable images of programs frees up secondary memory space on a laptop computer, since not all programs are used frequently. This reduces the size of the hard drive required on the laptop, giving an advantage in reduced size and weight.

The operating system can also be designed such that an interface is provided that allows drag and drop capabilities, so the user can move one program from one source and drop it directly into an MRAM module portion of the main memory. This allows the user to change the physical position of the executable image of the programs instantly. Further, the MRAM modules can store the program. When the MRAM module is removed, the user can insert the MRAM module in another computer system and start where the user left off. The MRAM module may store more than one program as well.

A third advantage is that the current state of a computer system can be stored in the MRAM module since it is non-volatile. This provides the user with a mobile computing environment, in a much smaller device than a laptop. The last known state of the first computer system can then be loaded instantly on a second computer, so that the user can resume working where the user left off when the memory module was removed from the first computer system. This embodiment allows a reboot directly to the last saved state of the computer system. Such states represent the conditions at which a computer system operates. An example being the state where the bootup procedure has been performed, the operating system has been loaded into the main memory, and various programs and data information have been stored within the memory as well. Since the MRAM modules are non-volatile, the system can look first for an MRAM module and access any current state stored therein. This provides near instantaneous bootup on a second computer. Of course, provisions will be provided that enable the system to do a check to confirm whether the peripheral devices from the first computer match those of the second computer and make the necessary modifications so that the computer state saved on the memory module is compatible with the peripherals available in the second computer system.

Accordingly, the use of fast, non-volatile RAM module allows the architecture of the computer to be redefined. The non-volatile RAM is comparable to SRAM and DRAM in access time so that it can function main memory. Further, the non-volatile RAM modules are less expensive, thereby reducing total cost of memory used within the computer system. In addition, the ability to hot-insert non-volatile RAM enables the performance capabilities of the computer to be increased significantly, as needed. Further still, the use of non-volatile RAM provides a mechanism to make the computer memory more flexible, which can increase the booting and shutdown speeds in mobile or laptop applications. The non-volatile RAM improves portability of programs and provides significant benefits to end users who can plugin the modules containing program images when desired. Additionally, the use of non-volatile MRAM modules provides greater memory flexibility, improves performance, saves time, and reduces costs in several applications as well.

Although the use of MRAM cells has been described within the specification, other types of non-volatile storage technologies may also benefit from this protocol. Other high-speed non-volatile technologies that currently exist may be hot insertable based on the teachings of the present invention. These high-speed non-volatile technologies include, but are not limited to, ferroelectric RAM (FeRAM), which uses the ferroelectric effect to store data in memory cells, as well as battery-backed RAM. In the case of a battery powered RAM system, what is normally a volatile memory system is able to retain the contents originally stored within the memory unit because of the power supplied by the battery attached to the RAM module.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A non-volatile memory module for use in a computer system having a main memory, the memory module comprising:
    means for removably inserting the non-volatile memory module directly into the main memory to function as a part of the main memory;
    a non-volatile memory store configured to be inserted directly into the main memory while the computer system is in operation to operate as part of the main memory for processing an executable program and having an access speed comparable to an access speed of the main memory;
    a memory bus interface, coupled to the non-volatile memory store, to interface with a bus line within the computer system; and
    interface circuitry, coupled to the non-volatile memory store and the memory bus interface, to perform power sensing, memory timing calibration, and system handshaking upon powerup of the memory module, wherein the non-volatile memory module can be inserted directly into the main memory or removed from the main memory before or after powerup of the computer system.

2. The memory module according to claim 1 wherein the non-volatile memory store comprises magnetic random access memory (MRAM).

3. The memory module according to claim 2 wherein the non-volatile memory store is configured to provide additional main memory to be accessed by the computer system immediately upon powerup of the memory module.

4. The memory module according to claim 1 wherein the non-volatile store comprises a volatile memory RAM module having an independent portable power supply built into the volatile RAM memory module to preserve information stored within the volatile RAM memory module.

5. The memory module according to claim 1 wherein the non-volatile memory store comprises Ferroelectric random access memory (FeRAM).

6. A computer system comprising:
    a central processing unit (CPU);
    a main memory, coupled to the CPU, in which an operating system may be loaded upon power up of the computer system and which controls the primary operation of the CPU and main memory; and
    a secondary main memory, configured to be removably inserted directly into the main memory, having an access speed on the order of an access speed of the main memory and being operable with the main memory, the secondary main memory being adapted to be removed from the main memory or inserted directly into the main memory during operation of the computer system, to operate as part of the main memory for processing an executable program.

7. The computer system according to claim 6 wherein the secondary main memory comprises a non-volatile memory store.

8. The computer system according to claim 7 wherein the non-volatile memory store comprises magnetic random access memory (MRAM).

9. The computer system according to claim 7 wherein the non-volatile memory store is configured to operate as part of the main memory immediately upon addition of the non-volatile memory store directly into the main memory.

10. The computer system according to claim 7 wherein the non-volatile memory store comprises a memory unit that is powered independently of and external to the computer system.

11. The computer system according to claim 7 wherein the non-volatile memory store comprises Ferroelectric random access memory (FeRAM).

12. The computer system according to claim 6 wherein the computer system is a portable computer.

13. The computer system according to claim 6 wherein the secondary main memory is removably adapted to transfer programs directly between the main memories of the computer system and a portable computer.

14. A computer system comprising:
a central processing unit (CPU);
a main memory, coupled to the CPU, in which an operating system may be loaded upon power up of the computer system and which controls the primary operation of the CPU and main memory; and
a secondary main memory, being configured to be directly coupled to the main memory, so that the secondary main memory can function as a part of the main memory to operate as part of the main memory for executing a program in the main memory and/or to provide a computer state directly into the main memory, and being configured to be directly decoupled from the main memory during operation of the computer system.

15. The computer system according to claim 14 wherein the secondary main memory comprises a non-volatile memory store.

16. The computer system according to claim 15 wherein the non-volatile memory store comprises magnetic random access memory (MRAM).

17. The computer system according to claim 15 wherein the non-volatile memory store is configured to increase usable main memory for an executable program to be accessed by the operating system immediately upon directly coupling the non-volatile memory store to the main memory.

18. The computer system according to claim 15 wherein the non-volatile memory store comprises a memory unit that is powered independently of and external to the computer system.

19. The computer system according to claim 15 wherein the non-volatile memory store comprises Ferroelectric random access memory (FeRAM).

20. The computer system according to claim 14 wherein the computer system is a portable computer.

21. A method of adding memory to a main memory of a computer system during an operating state, comprising:
selecting a non-volatile memory store having an access speed comparable to an access speed of the main memory;
removably inserting the non-volatile memory store directly into the main memory to function as part of the main memory within the computer system;
recognizing the inserted non-volatile memory store by the computer system; and
configuring the computer system to access the inserted non-volatile memory store so that the non-volatile memory store functions as part of the main memory to operate as part of the main memory for processing an executable program in the main memory.

22. The method according to claim 21 also comprising accessing at least one executable program and related data previously stored in the non-volatile memory store stored prior to the inserting step.

23. The method according to claim 21 further comprising the steps of:
saving within the non-volatile memory store at least one executable program and related data stored within the memory store; and
powering down the computer system to end the operating state.

24. The method according to claim 23 further comprising the steps of:
powering up the computer system after the powering down step; and
accessing at least one executable program and related data.

25. The method according to claim 23 further comprising the steps of:
removing the non-volatile memory store from the computer system; and
installing the removed non-volatile memory store into a second computer system to enable the stored executable program and related data to be accessible in the second computer system.

26. The method according to claim 21 wherein the recognizing step comprises supplying power to the non-volatile memory store.

27. The method according to claim 21 wherein the recognizing step further comprises calibrating the non-volatile memory store relative to the computer system.

28. The method according to claim 21 wherein the recognizing step includes incorporating the non-volatile store as a part of the main memory at a system level only, and not at the operating system or software level.

29. A writable non-volatile memory store having at least one executable program stored thereon and operable from the non-volatile memory store only upon removable insertion of the non-volatile memory store directly into a main memory store within a computer system while the computer system is in operation to effectively load the executable program into the main memory store without accessing secondary computer memory storage.

30. The writable non-volatile memory store according to claim 29 further comprising a key code to enable access to the at least one executable program stored in the non-volatile memory store.

31. The invention according to claim 29 wherein the non-volatile memory store comprises MRAM.

32. A writable non-volatile memory adapted to be removably inserted directly into a main memory of a computer system and detached therefrom while the computer system is in operation, and being adapted to store a current state of the main memory of the computer system and to transfer the current state to a main memory in a second computer system.

33. The non-volatile memory of claim 32, wherein an access speed of the non-volatile memory is comparable to an access speed of the second computer system.

* * * * *